(12) United States Patent
Liang et al.

(10) Patent No.: US 9,059,142 B2
(45) Date of Patent: Jun. 16, 2015

(54) SEMICONDUCTOR DEVICE HAVING VERTICAL GATES AND FABRICATION THEREOF

(75) Inventors: Wen-Ping Liang, Taoyuan (TW);
Chiang-Hung Lin, Taoyuan (TW);
Kuo-Hui Su, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/555,640

(22) Filed: Jul. 23, 2012

(65) Prior Publication Data

US 2014/0021535 A1 Jan. 23, 2014

(51) Int. Cl.
*H01L 29/66* (2006.01)
*H01L 21/336* (2006.01)
*H01L 29/423* (2006.01)
*H01L 29/49* (2006.01)
*H01L 29/78* (2006.01)
*H01L 29/51* (2006.01)

(52) U.S. Cl.
CPC ........ *H01L 29/4236* (2013.01); *H01L 29/4966* (2013.01); *H01L 29/517* (2013.01); *H01L 29/66621* (2013.01); *H01L 29/78* (2013.01)

(58) Field of Classification Search
USPC .......... 257/330, 332, 346, 387–388, E29.201, 257/E21.383, E21.384, E21.419, E21.428, 257/E21.622; 438/259, 270
See application file for complete search history.

(56) References Cited

U.S. PATENT DOCUMENTS

| | | | |
|---|---|---|---|
| 2003/0136978 A1* | 7/2003 | Takaura et al. | 257/210 |
| 2005/0275042 A1* | 12/2005 | Hwang et al. | 257/401 |
| 2007/0048942 A1* | 3/2007 | Hanson et al. | 438/268 |
| 2008/0164532 A1* | 7/2008 | Chidambarrao et al. | 257/369 |
| 2010/0062592 A1* | 3/2010 | Clark | 438/591 |
| 2010/0210105 A1* | 8/2010 | Baek et al. | 438/653 |
| 2011/0212607 A1* | 9/2011 | Kim | 438/514 |
| 2013/0062669 A1* | 3/2013 | Chen et al. | 257/288 |

FOREIGN PATENT DOCUMENTS

TW 426952 3/2001

* cited by examiner

*Primary Examiner* — Khaja Ahmad

(57) ABSTRACT

A method for forming a semiconductor device with a vertical gate is disclosed, including providing a substrate, forming a recess in the substrate, forming a gate dielectric layer on a sidewall and a bottom of the recess, forming an adhesion layer in the recess and on the gate dielectric layer, wherein the adhesion layer is a metal silicide nitride layer, and forming a gate layer in the recess and on the adhesion layer.

14 Claims, 4 Drawing Sheets

SEMICONDUCTOR DEVICE HAVING VERTICAL GATES AND FABRICATION THEREOF

BACKGROUND OF THE INVENTION

1. Field of the Invention

The present invention relates to a semiconductor device, and more particularly, to a semiconductor device having vertical gates.

2. Description of the Related Art

Recently, with high integration of semiconductor memory devices, sizes have shrunk and patterns have become fine. As the size of the device becomes smaller, a gate channel length is also reduced, causing operational speed or input/output rate of information to be slower due to current leakage caused by short channel effect, hot carrier effect and so on.

To prevent this phenomenon, vertical gates for securing a channel length have been proposed. Tungsten is used as the main material of gate in the conventional gate structures. However, for highly advanced semiconductor technology, tungsten which has great grain size is not suitable to be used as a gate material because tungsten presents higher resistance for vertical gates with reduced sizes. Therefore, there is a need to find a suitable material and fabrication process for vertical gate transistors.

BRIEF SUMMARY OF INVENTION

The invention provides a method for forming a semiconductor device with a vertical gate, comprising providing a substrate, forming a recess in the substrate, forming a gate dielectric layer on a sidewall and a bottom of the recess, forming an adhesion layer in the recess and on the gate dielectric layer, wherein the adhesion layer is a metal silicide nitride layer, and forming a gate layer in the recess and on the adhesion layer.

The invention further comprises a semiconductor device with a vertical gate, comprising a substrate comprising a recess therein, a gate dielectric layer on a sidewall and a bottom of the recess, an adhesion layer in the recess and on the gate dielectric layer, wherein the adhesion layer is a metal silicide nitride layer; and a gate layer in the recess and on the adhesion layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Figure 1A:
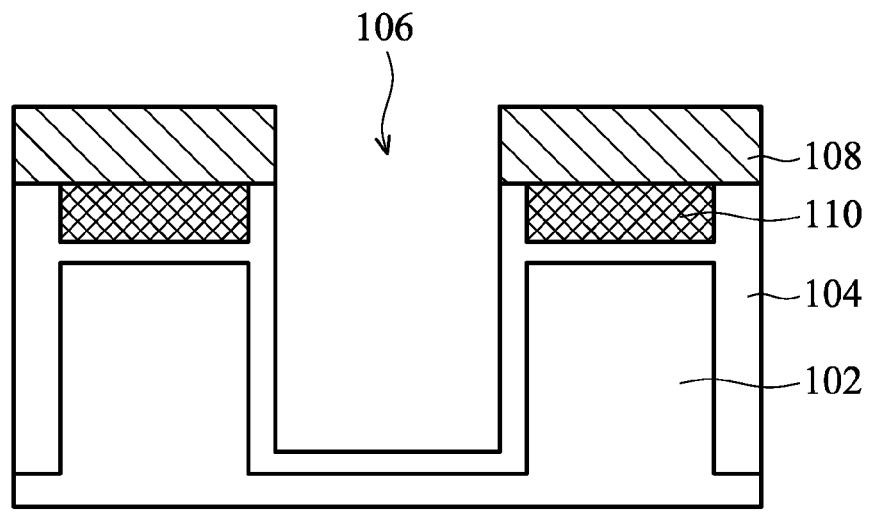
FIG. 1A~FIG. 1C show intermediate stages of a method for forming a semiconductor device with a vertical gate.
Figure 1B:
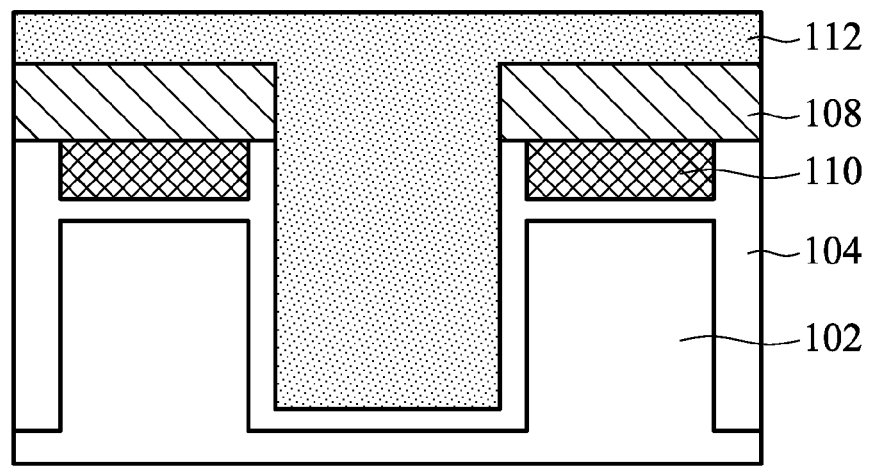
Figure 1C:
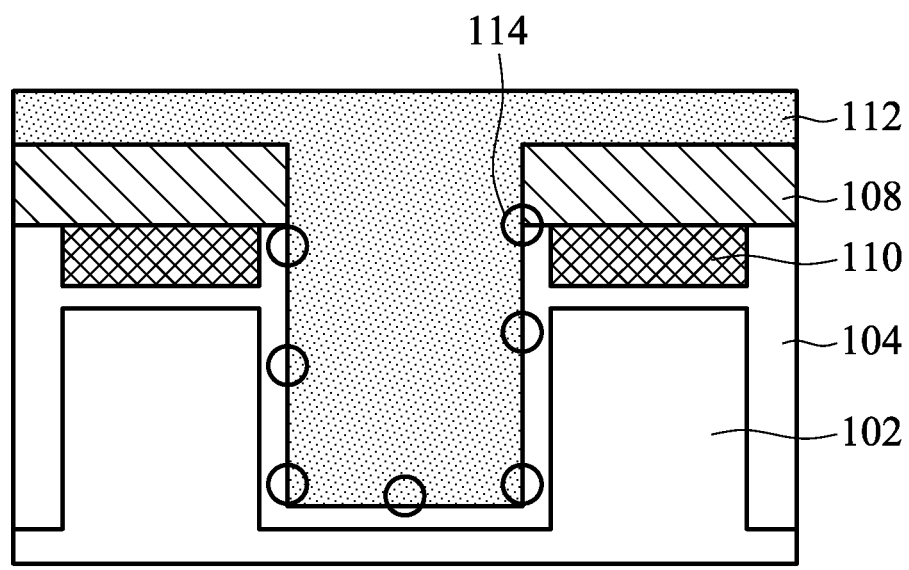

A method for forming a semiconductor device with a vertical gate is illustrated in accordance with FIG. 1A~FIG. 1C. Referring to FIG. 1A, a substrate 102 suitable for integrated circuit manufacturing is provided. The substrate 102 may be formed of a semiconductor material, such as silicon, silicon germanium, silicon carbide, gallium arsenide, or other commonly used semiconductor materials. Next, a mask layer 108 is formed on the substrate 102. The mask layer 108 is then patterned by lithography and etching. Thereafter, the substrate 102 is patterned to form a recess 106 using a mask layer 108 as a mask. The mask layer 108 may comprises silicon oxide, silicon nitride or a combination thereof. Preferably, the mask layer 108 comprises silicon nitride. A gate dielectric layer 104 is formed along sidewalls and a bottom surface of the recess 106. The gate dielectric layer 104 can be silicon oxide, silicon nitride, or other high dielectric materials, such as $Ta_2O_5$, $HfO_2$, $HSiO_x$, $Al_2O_3$, $InO_2$, $La_2O_3$, $ZrO_2$ or $TaO_2$. A polysilicon layer 110 is formed between the substrate 102 and the mask layer 108. A source region and/or a drain region can be formed in the polysilicon layer 110. Referring to FIG. 1B, a gate layer 112 preferably comprising titanium nitride (TiN) is formed in the recess 106 and on the gate dielectric layer 104, and an anneal process is performed thereafter. Referring to FIG. 3, after the annealing step, voids 114 are generated at the interface between the gate dielectric layer 104 and the gate layer 112. The voids affect performance of the semiconductor device and some endurance problems are found in accordance with the voids 114.

Figure 2A:
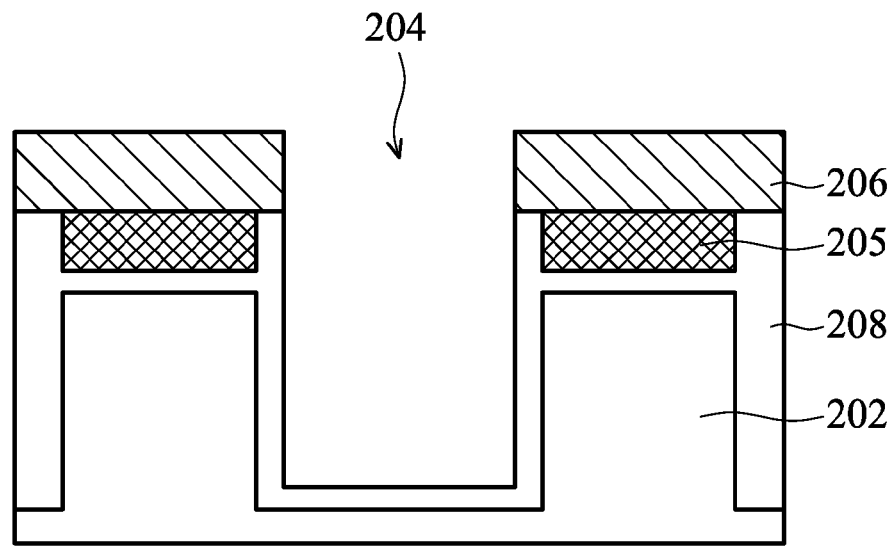
FIG. 2A~FIG. 2C show intermediate stages of a method for forming a semiconductor device with a vertical gate of an embodiment of the invention.
Figure 2B:
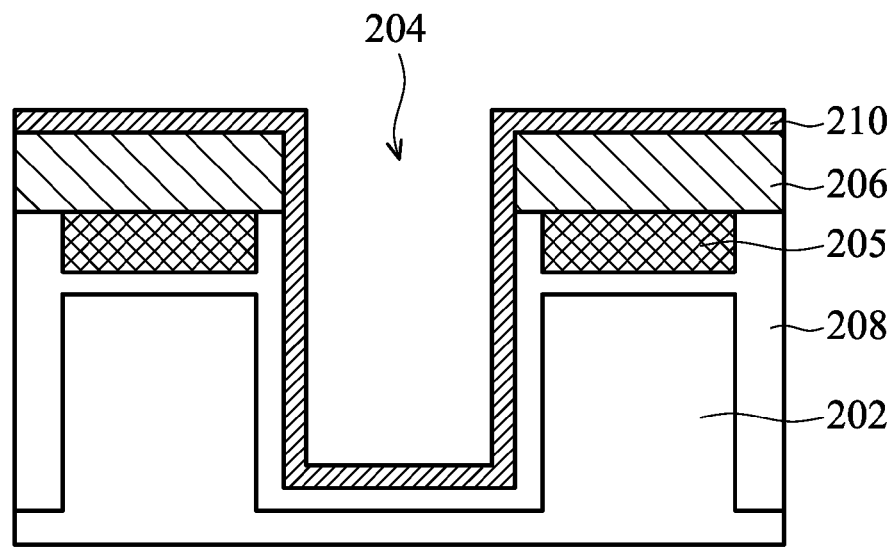
Figure 2C:
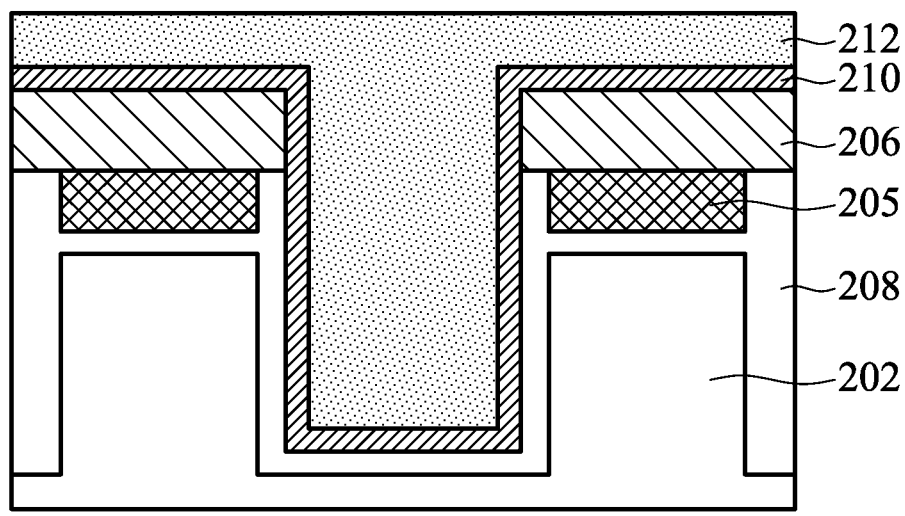

A method for forming a semiconductor device with a vertical gate of an embodiment of the invention is illustrated in accordance with FIG. 2A~FIG. 2C. Referring to FIG. 2A, a substrate 202 suitable for integrated circuit manufacturing is provided. The substrate 102 may be formed of a semiconductor material, such as silicon, silicon germanium, silicon carbide, gallium arsenide, or other commonly used semiconductor materials. In a preferred embodiment of the invention, the substrate 202 is formed of silicon. Next, a mask layer 206 is formed on the substrate 202. The mask layer 206 is then patterned by lithography and etching. Thereafter, the substrate 202 is patterned to form a recess 204 using a mask layer 206 as a mask. In an embodiment of the invention, the mask layer 206 comprises silicon oxide, silicon nitride or a combination thereof. Preferably, the mask layer 206 comprises silicon nitride. A gate dielectric layer 208 is formed along sidewalls and a bottom surface of the recess 204. The gate dielectric layer 208 can be silicon oxide, silicon nitride, or other high dielectric materials, such as $Ta_2O_5$, $HfO_2$, $HSiO_x$, $Al_2O_3$, $InO_2$, $La_2O_3$, $ZrO_2$ or $TaO_2$. A polysilicon layer 205 is formed between the substrate 202 and the mask layer 206. In an embodiment of the invention, a source region and/or a drain region can be formed in the polysilicon layer 205.

Referring to FIG. 2B, an adhesion layer 210 is formed in the recess 204 and on the mask layer 206. In an embodiment of the invention, the adhesion layer 210 is a metal silicide nitride layer, specifically the metal silicide nitride layer can be ($M_xSi_{(1-x)}N$), wherein the metal (M) can be titanium, tantalum or tungsten, and x can be in a range of 0.1~0.9 and preferably is in a range of 0.3~0.6.

Preferable, the metal (M) is titanium and the adhesion layer 210 preferably is titanium silicide nitride. The titanium silicide nitride can be formed by sequential flow deposition (SFD). The process sequence detailing the various steps used for the formation of a titanium silicide nitride (TiSiN) layer is illustrated in the following description. Titanium tetrachloride ($TiCl_4$), helium (He) and nitrogen are introduced into a CVD deposition chamber via a first pathway (gas line), and ammonia ($NH_3$), along with nitrogen ($N_2$), being introduced into the deposition chamber via a second pathway to perform a deposition step. Helium (He) and argon (Ar), or other inert gases, may also be used, either singly or in combination (i.e., as a gas mixture) within either gas line. In an example, the reaction can be performed at a titanium tetrachloride (TiCl$_4$) flow rate of about 50 mg/min (milligrams/minute) to about 350 mg/min, introduced into the deposition chamber through the first pathway and an ammonia (NH$_3$) flow rate of about 100 sccm (standard cubic centimeters per minute) to about 500 sccm, introduced into the deposition chamber through the second pathway. A total pressure range of about 5 torr to about 30 torr and a pedestal temperature between about 400° C. to about 700° C. may be used. Followed by reaction of titanium tetrachloride (TiCl$_4$) and ammonia (NH$_3$), a first purge step is performed. The process chamber is purged to remove any reaction by-products generated during reaction. These undesirable reaction by-products may interfere with the adhesion properties of films subsequently deposited on the titanium silicide nitride (TiSiN) layer. The process chamber is purged by providing purge gas to the process chamber and then evacuating both the purge gas as well as the reaction by-products therefrom. The purge gas may be one or more gases selected from the group of nitrogen (N$_2$), hydrogen (H$_2$), helium (He), argon (Ar), neon (Ne) and xenon (Xe), among others. Typically, the process chamber is purged by providing a purge gas thereto at a flow rate of about 100 sccm to about 1000 sccm, for up to about 5 minutes.

Thereafter, ammonia (NH$_3$) is introduced into the chamber to perform a first nitrification step, and followed by performing a second purge step wherein the process chamber is purged by providing a purge gas to the process chamber and then evacuating both the purge gas as well as the reaction by-products therefrom. The purge gas may be one or more gases selected from the group of nitrogen (N$_2$), hydrogen (H$_2$), helium (He), argon (Ar), neon (Ne) and xenon (Xe), among others. Next, the formed layer is exposed to a silicon-containing gas for silicon (Si) incorporation into the layer of titanium nitride (TiN), converting it into a titanium silicide nitride (TiSiN) layer. The silicon-containing gas may be, for example, silane (SiH$_4$) or disilane (Si$_2$H$_6$), among others. The silicon-containing gas may be mixed with one or more gases selected from the group consisting of hydrogen (H$_2$), nitrogen (N$_2$), argon (Ar) and helium (He), among others. Typically, the silicide formation step can be performed with a silicon-containing gas flow rate of about 20 sccm to about 3000 sccm, a total pressure of about 0.5 torr to about 20 torr and a temperature of about 500° C. to about 700° C. When the silicon-containing gas is mixed with hydrogen (H$_2$), the ratio of the silicon-containing gas to the hydrogen (H$_2$) is preferably greater than 1. More preferably the silicide formation step is performed with a silicon-containing gas flow rate of about 80 sccm, a hydrogen (H$_2$) flow rate of about 450 sccm, a total pressure of about 5 torr and a temperature of about 650° C. Thereafter, ammonia (NH$_3$), along with nitrogen (N$_2$), is introduced into the deposition chamber via a second pathway to perform a second nitrification step, to finalize a first cycle of deposition. There can be 5~20 cycles for the deposition of the titanium silicide nitride layer. In an embodiment of the invention, the adhesion layer can have a thickness of 5 nm~20 nm. Other process chambers are within the scope of the invention, and the parameters listed above may vary according to the particular process chamber used to form the titanium silicide nitride (TiSiN) layer. For example, other process chambers may have a larger or smaller volume, requiring gas flow rates that are bigger or smaller than those recited for process chambers available from Applied Materials, Inc., Santa Clara, Calif.

Next, referring to FIG. 2C, a gate layer 212 is formed in the recess 204 and on the adhesion layer 210. The gate layer 212 preferably comprises titanium nitride, tantalum nitride or tungsten nitride, since these materials have a small crystal size and present low resistance. Thereafter, an anneal process is performed. The annealing process can have a temperature of 800~1200° C. Reference to standard semiconductor formation technologies may be made for the steps for forming a device, such as patterning the gate layer, forming source/drain regions, forming spacers, forming contacts, or forming an inter layer or inter metal dielectric layer, thus, detailed description herein is not provided.

Application in accordance with the metal-silicide nitride adhesion layer 210 has advantages of preventing voids between the gate dielectric layer 208 and issues in accordance with the voids can be eliminated. Further, the metal-silicide nitride adhesion layer 210 can reduce resistance of the vertical gate of the transistor.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device with a vertical gate, comprising:
   providing a substrate;
   forming a recess in the substrate;
   forming a gate dielectric layer on a sidewall and a bottom of the recess;
   forming a polysilicon layer on the substrate;
   after forming of the polysilicon layer on the substrate, forming source/drain regions in the polysilicon layer, wherein the substrate is separated from the source/drain regions by the gate dielectric layer;
   forming an adhesion layer in the recess and on the gate dielectric layer, wherein the adhesion layer is a metal silicide nitride layer; and
   forming a gate layer in the recess and on the adhesion layer.

2. The method for forming a semiconductor device with a vertical gate as claimed in claim 1, wherein the metal of the metal silicide nitride layer is titanium, tantalum or tungsten.

3. The method for forming a semiconductor device with a vertical gate as claimed in claim 1, wherein the gate layer comprises titanium nitride (TiN).

4. The method for forming a semiconductor device with a vertical gate as claimed in claim 1, wherein steps of forming the recess in the substrate comprises:
   forming a mask layer on the substrate;
   patterning the mask layer with lithography and etching; and
   etching the substrate using the mask layer as a mask.

5. The method for forming a semiconductor device with a vertical gate as claimed in claim 4, wherein the mask layer comprises titanium nitride.

6. The method for forming a semiconductor device with a vertical gate as claimed in claim 1, wherein the adhesion layer has a thickness of 5 nm-20 nm.

7. The method for forming a semiconductor device with a vertical gate as claimed in claim 1, wherein the adhesion layer is formed by sequential flow deposition (SFD).

8. The method for forming a semiconductor device with a vertical gate as claimed in claim 7, wherein the sequential flow deposition comprises:
   performing a cycle of deposition, which comprises:

introducing titanium tetrachloride (TiCl4) and ammonia (NH3) into a deposition chamber to perform a deposition step;

performing a first purge step;

introducing ammonia (NH3) into the deposition chamber to perform a first nitrification step;

performing a second purge step;

introducing a silicon-containing gas into the deposition chamber;

performing a third purge step;

introducing ammonia (NH3) into the deposition chamber to perform a second nitrification step, and repeating the cycle of deposition 5-20 times.

9. The method for forming a semiconductor device with a vertical gate as claimed in claim 8, wherein the silicon-containing gas comprises silane (SiH4) or disilane (Si2H6).

10. A semiconductor device with a vertical gate, comprising:

a substrate, comprising a recess therein;

a gate dielectric layer overlying the substrate and on a sidewall and a bottom of the recess;

a polysilicon layer overlying the gate dielectric layer, wherein the polysilicon layer comprises source/drain regions therein and the substrate is separated from the source/drain regions by the gate dielectric layer;

an adhesion layer in the recess and on the gate dielectric layer, wherein the adhesion layer is a metal silicide nitride layer; and a gate layer in the recess and on the adhesion layer.

11. The semiconductor device with a vertical gate as claimed in claim 10, wherein there is substantially no void between the gate layer and the gate dielectric layer.

12. The semiconductor device with a vertical gate as claimed in claim 10, wherein the metal of the metal silicide nitride layer is titanium, tantalum or tungsten.

13. The semiconductor device with a vertical gate as claimed in claim 10, wherein the gate layer comprises titanium nitride (TiN).

14. The semiconductor device with a vertical gate as claimed in claim 10, wherein the adhesion layer has a thickness of 5 nm-20 nm.

* * * * *